(12) United States Patent
Martinsen et al.

(10) Patent No.: US 10,957,541 B2
(45) Date of Patent: Mar. 23, 2021

(54) SHORT PULSE FIBER LASER FOR LTPS CRYSTALLIZATION

(71) Applicant: nLIGHT, Inc., Vancouver, WA (US)

(72) Inventors: Robert J. Martinsen, West Linn, OR (US); Scott R. Karlsen, Battle Ground, WA (US); Ken Gross, Vancouver, WA (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 16/598,210

(22) Filed: Oct. 10, 2019

(65) Prior Publication Data

US 2020/0043736 A1 Feb. 6, 2020

Related U.S. Application Data

(62) Division of application No. 14/144,350, filed on Dec. 30, 2013, now Pat. No. 10,453,691.

(60) Provisional application No. 61/747,805, filed on Dec. 31, 2012.

(51) Int. Cl.
| | |
|---|---|
| *H01L 21/268* | (2006.01) |
| *H01L 21/02* | (2006.01) |
| *B23K 26/00* | (2014.01) |
| *B23K 26/0622* | (2014.01) |
| *B23K 103/00* | (2006.01) |

(52) U.S. Cl.
CPC ........ *H01L 21/268* (2013.01); *B23K 26/0006* (2013.01); *B23K 26/0624* (2015.10); *H01L 21/02532* (2013.01); *H01L 21/02686* (2013.01); *B23K 2103/56* (2018.08)

(58) Field of Classification Search
CPC ............. H01L 21/268; H01L 21/02532; H01L 21/02686; B23K 26/0006; B23K 26/0624; B23K 2103/56

USPC ........................... 257/98, 610; 438/502, 154
See application file for complete search history.

(56) References Cited

U.S. PATENT DOCUMENTS

| | | | |
|---|---|---|---|
| 6,528,397 B1 | 3/2003 | Taketomi et al. | |
| 7,700,463 B2 | 4/2010 | Shimomura | |
| 7,991,022 B1* | 8/2011 | Soh | H01S 3/302 |
| | | | 372/3 |

(Continued)

FOREIGN PATENT DOCUMENTS

| | | |
|---|---|---|
| CN | 101256987 | 9/2008 |
| KR | 2002-0094765 | 12/2002 |

OTHER PUBLICATIONS

Decision of Rejection (w/ English translation) for related Korean Application No. 10-2015-7017295, dated Jan. 15, 2019, 12 pages.

(Continued)

*Primary Examiner* — Bo Fan
(74) *Attorney, Agent, or Firm* — Klarquist Sparkman, LLP

(57) ABSTRACT

Laser pulses from pulsed fiber lasers are directed to an amorphous silicon layer to produce a polysilicon layer comprising a disordered arrangement of crystalline regions by repeated melting and recrystallization. Laser pulse durations of about 0.5 to 5 ns at wavelength range between about 500 nm and 1000 nm, at repetition rates of 10 kHz to 10 MHz can be used. Line beam intensity uniformity can be improved by spectrally broadening the laser pulses by Raman scattering in a multimode fiber or by applying varying phase delays to different portions of a beam formed with the laser pulses to reduce beam coherence.

20 Claims, 14 Drawing Sheets

(56) References Cited

U.S. PATENT DOCUMENTS

| | | | |
|---|---|---|---|
| 8,144,740 | B1 | 3/2012 | Brown et al. |
| 2001/0036209 | A1 | 11/2001 | Delfyett et al. |
| 2002/0136246 | A1* | 9/2002 | Kubota .............. B23K 26/0613 372/21 |
| 2003/0022471 | A1 | 1/2003 | Taketomi et al. |
| 2004/0232432 | A1 | 11/2004 | Sato et al. |
| 2005/0059223 | A1 | 3/2005 | Im |
| 2005/0189542 | A1 | 9/2005 | Kudo |
| 2007/0087488 | A1* | 4/2007 | Moriwaka ......... H01L 21/02532 438/149 |
| 2007/0178674 | A1 | 8/2007 | Imai et al. |
| 2008/0213984 | A1 | 9/2008 | Moriwaka |
| 2009/0246413 | A1* | 10/2009 | Murakami .............. C23C 14/08 427/596 |
| 2009/0253273 | A1 | 10/2009 | Sano |
| 2010/0272129 | A1 | 10/2010 | Harter et al. |
| 2011/0259861 | A1 | 10/2011 | Crist |
| 2011/0306143 | A1 | 12/2011 | Chiou |
| 2012/0156100 | A1 | 6/2012 | Tsai |
| 2014/0187055 | A1 | 7/2014 | Martinsen et al. |
| 2014/0269792 | A1 | 9/2014 | Ota |

OTHER PUBLICATIONS

First Office Action from Chinese Application No. 201380068763.3, dated Oct. 9, 2016, 23 pages (with English translation).

Delmdahl, Ralph, "The Excimer Laser: Precision Engineering," *Nature Photonics*, vol. 4, p. 286 (May 2010).

Delmdahl et al., "Excimer Lasers in Smart Phone and Tablet PC Manufacturing," *OnBoard Technology*, pp. 22-24 (Sep. 2011).

International Search Report and Written Opinion from International Application No. PCT/US2013/076697, dated Apr. 17, 2014 7 pages.

Notice of Preliminary Rejection for related Korean Application No. 10-2015-7017295, dated Aug. 29, 2018, 18 pages.

Official Letter and Search Report from related Taiwan Patent Application No. 102147854, dated Aug. 18, 2015, 19 pages. (with English translation).

Official Letter and Search Report from related Taiwan Patent Application No. 102147854, dated May 10, 2016, 19 pages (with English translation).

Second Office Action (with English translation) for related Chinese Application No. 201380068763.3, dated May 27, 2017, 3 pages.

* cited by examiner

SHORT PULSE FIBER LASER FOR LTPS CRYSTALLIZATION

CROSS REFERENCE TO RELATED APPLICATION

This application is a divisional application of U.S. patent application Ser. No. 14/144,350, filed Dec. 30, 2013, which claims the benefit of U.S. Provisional Application No. 61/747,805, filed Dec. 31, 2012, both of which are incorporated herein by reference.

FIELD

The disclosure pertains to methods and apparatus for forming silicon layers for thin film transistors.

BACKGROUND

Silicon substrates of various types are used in numerous applications including solar cells and display devices. So-called amorphous silicon (a-Si) is used in high resolution liquid crystal displays to provide an active layer in which thin film transistors can be defined. Amorphous silicon can be deposited in thin films using PECVD. Low temperature polysilicon (LTPS) can be produced by exposing an a-Si layer to high intensity ultraviolet laser pulses that rapidly melt the deposited a-Si layer without heating the underlying substrate. The a-Si layer then crystallizes in grains having sizes that are dependent upon temperature gradients during processing. Typical mobility of an LTPS layer is on the order of about 50-150 $cm^2$/V-sec, superior to the 0.5 $cm^2$/V-sec mobility associated with a-Si.

Conventional LTPS processing is based on surface treatment with an excimer laser, or so-called excimer layer annealing (ELA). In ELA, a line-shaped, approximately uniform laser beam (typically at 308 nm) is directed as a series of pulses of durations of about 25 ns to an a-Si layer that is heated and melted. The molten layer then recrystallizes to form a layer of polycrystalline silicon (p-Si). Laser pulse energy and beam uniformity must be precisely controlled. Each area of the target a-Si layer is exposed to several excimer laser pulses, and the heating, melting, and recrystallization process also repeats. The resulting LTPS layer exhibits a rectangular array of crystalline regions as shown in FIGS. 1A-1B. Processing is generally targeted to produce crystalline regions or "grains" that have dimensions of about 300 nm for most thin film transistor (TFT) backplanes.

Excimer lasers are complex and expensive to maintain as production equipment. Even the best excimer lasers tend to have very limited service lifetimes, and replacement of excimer laser cavities and associated optical components thereof can be disruptive and expensive. Although satisfactory results can be obtained, total processing costs associated with ELA remain high.

SUMMARY

Short optical pulses at visible wavelengths can be used to produce high mobility p-Si TFT backplanes for active matrix displays. Pulsed fiber lasers emitting at 532 nm can be used to produce randomly oriented silicon crystal grains with electron mobilities exceeding 100 $cm^2$/V-s.

Representative methods of processing a substrate comprise producing an optical line beam based on repetitive laser pulses from a fiber laser at a repetition frequency between about 1 kHz and 1 MHz and having pulse durations less than about 25 ns. At least one of a substrate that includes a silicon layer and the optical line beam is scanned so as to produce silicon crystal grains in the silicon layer such that the processed silicon layer has a mobility of at least about 50 $cm^2$/V-sec. In representative examples, the laser pulses have a wavelength of about 532 nm and the repetition frequency is between about 100 kHz and 200 kHz. Typically, the laser pulse durations are less than about 10 ns or 1.5 ns. In some examples, the processed silicon layer has a mobility of at least about 50 $cm^2$/V-s or at least about 100 $cm^2$/V-s. In some embodiments, the processed silicon layer has silicon crystal grains having an average grain size of between about 200 nm and 500 nm and the silicon crystal grains are randomly oriented. In some examples, the effective fluence is between about 20 $mJ/cm^2$ and 200 $mJ/cm^2$. In other embodiments, the laser pulses are processed to produce spectrally enhanced pulses in which at least about 10% of the pulse energy is frequency shifted, and the spectrally enhanced pulses are directed to the substrate. In some embodiments, the spectrally enhanced pulses are produced by Raman scattering in a multimode optical fiber, and at least about 25% of the pulse energy is frequency shifted. According to other examples, a plurality of phase delays is applied to different portions of the repetitive laser pulses, and the line beam is formed with the phase delayed and spectrally-enhanced optical pulses.

Laser annealing systems comprise a pulsed laser configured to provide laser pulses of pulse durations less than 10 ns at a repetition rate of between 10 kHz and 1 MHz. An optical system is configured to receive the laser pulses and produce a line beam. A scanning assembly is configured so that the line beam and a substrate move with respect to each other so that the line beam is scanned across a substrate surface, wherein a line beam area is selected so that the repetitive laser pulses produce repetitive melting of an a-Si layer on the substrate surface. In typical examples, the laser pulses have durations of between about 0.5 and 2 ns, the pulse repetition rate is between 70 and 120 kHz, a pulse wavelength is 532 nm, and the pulse energy is between about 10 and 100 µJ. In some examples, a laser pulse spectrum enhancer is configured to receive the laser pulses and produce spectrally broadened pulses based on Raman scattering with a multimode fiber. In other examples, a stepped mirror assembly that includes at least two reflective surfaces is configured to provide a phase delay between different laser pulse portions, wherein the phase delay is based on a reflective surface separation. In typical embodiments, the phase delay corresponds to a reflective surface separations of at least 10 mm, 25 mm, 40 mm, or 50 mm.

Methods of processing a silicon layer comprise exposing the silicon layer to a plurality of laser pulses at a wavelength of about 532 nm to form substantially randomly oriented crystalline silicon grains having dimensions of between about 200 nm and 400 nm and a mobility in the silicon layer of at least 50 $cm^2$/V-s. The exposed silicon layer is processed to define thin film transistors. In some examples, the laser pulses are produced with a pulsed fiber laser that produces laser pulses having a duration of between about 0.5 ns and 2 ns, and the laser pulses are subjected to Raman scattering to produce spectrally enhanced pulses prior to exposing the silicon layer. Active matrix displays employing liquid crystals (LCD) or organic light-emitting diodes (OLED) include a silicon layer processed as described above.

The foregoing and other objects, features, and advantages of the invention will become more apparent from the following detailed description, which proceeds with reference to the accompanying figures.

BRIEF DESCRIPTION OF THE DRAWINGS

FIG. 6A illustrates output intensity distribution associated with a seed laser, and FIG. 6B illustrates output intensity distribution with a pulsed laser beam coupled to the multimode fiber offset from core center and at a laser power of about 5.9 W demonstrating intensity uniformity improvement by Raman scattering.

FIG. 8A illustrates output intensity distribution associated with a seed laser, and FIG. 8B illustrates output intensity distribution with a pulsed laser beam coupled to the multimode fiber at a laser average power of about 5.5 W, demonstrating beam improvement provided by Raman scattering.

DETAILED DESCRIPTION

Figure 1A:
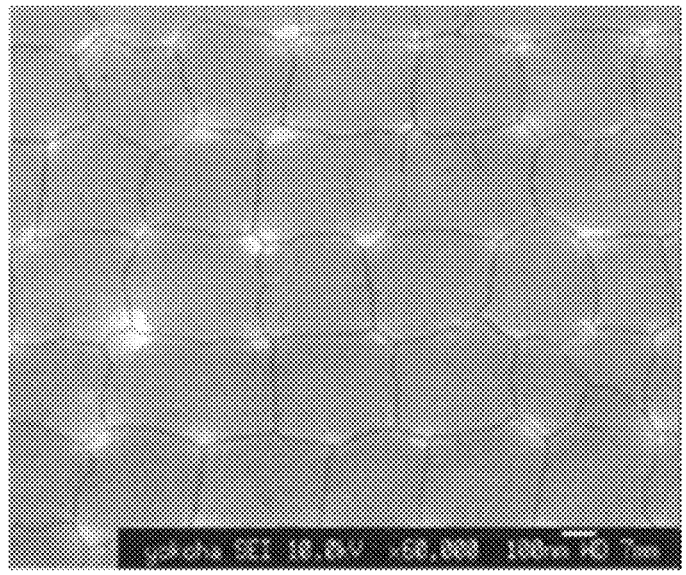
FIGS. 1A-1B illustrate a representative conventional excimer laser annealed (ELA) LTPS substrate.
Figure 1B:
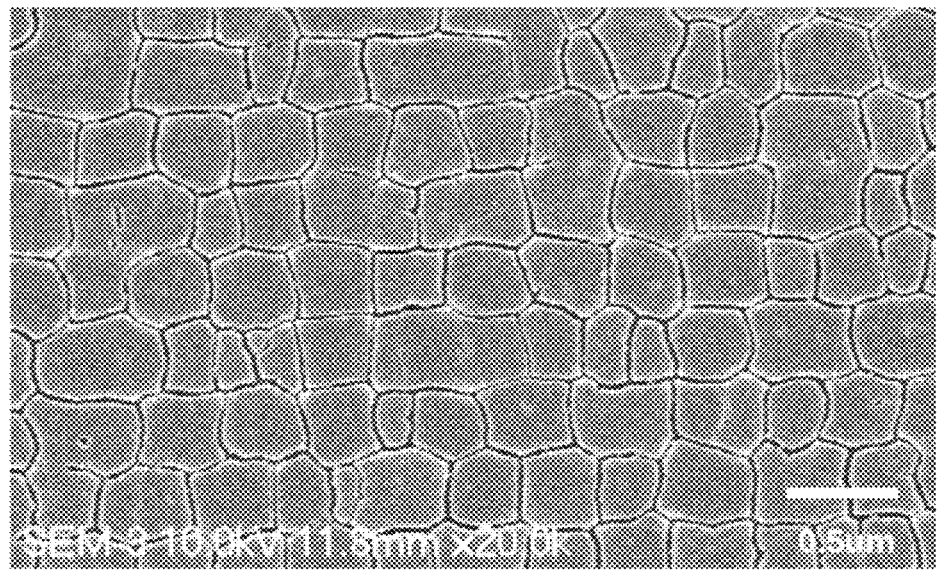

The following disclosure is presented in the context of representative embodiments that are not to be construed as being limiting in any way. This disclosure is directed toward all novel and non-obvious features and aspects of the various disclosed embodiments, alone and in various combinations and sub-combinations with one another. The disclosed methods, apparatus, and systems are not limited to any specific aspect or feature or combination thereof, nor do the disclosed embodiments require that any one or more specific advantages be present or problems be solved.

Although the operations of the disclosed methods are described in a particular, sequential order for convenient presentation, it should be understood that this manner of description encompasses rearrangement of the operations, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other things and methods.

This disclosure sometimes uses terms like "produce," "generate," "select," "receive," "exhibit," and "provide" to describe the disclosed methods. These terms are high-level abstractions of the actual operations that are performed. The actual operations that correspond to these terms may vary depending on the particular implementation and are readily discernible by one of ordinary skill in the art.

The singular forms "a," "an," and "the" include the plural forms unless the context clearly dictates otherwise. The term "includes" means "comprises." Unless the context dictates otherwise, the term "coupled" means mechanically, electrically, or electromagnetically connected or linked and includes both direct connections or direct links and indirect connections or indirect links through one or more intermediate elements not affecting the intended operation of the described system.

Certain terms may be used such as "up," "down," "upper," "lower," and the like. These terms are used, where applicable, to provide some clarity of description when dealing with relative relationships. But, these terms are not intended to imply absolute relationships, positions, and/or orientations.

The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of components, percentages, temperatures, times, and so forth, as used in the specification or claims are to be understood as being modified by the term "about" or "approximately." Accordingly, unless otherwise indicated, implicitly or explicitly, the numerical parameters set forth are approximations that may depend on the desired properties sought and/or limits of detection under standard test conditions/methods. When directly and explicitly distinguishing embodiments from discussed prior art, the embodiment numbers are not approximates unless the word "about" is recited.

Figure 2:
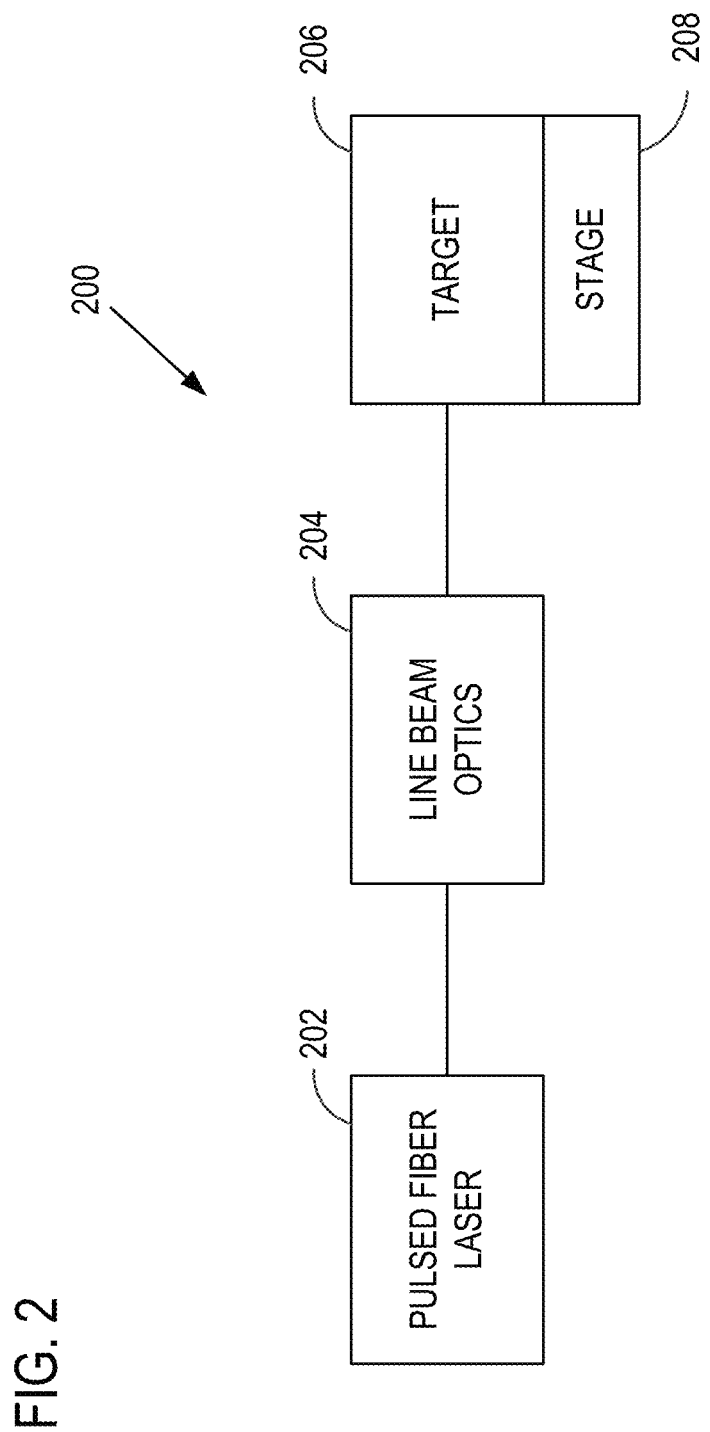
FIG. 2 is a block diagram of a representative processing system that includes a pulsed fiber laser.

With reference to FIG. 2, a pulsed fiber laser material processing system 200 includes a pulsed fiber laser 202 that produces a pulsed optical output that is coupled to a line beam forming optical system 204. A target 206 is situated to receive the line beam and can be secured to a translation stage 208 so that the line beam can be stepped or scanned across a surface of the target 206. Alternatively, the pulsed fiber laser and the beam forming optical system 204 can be stepped or scanned with respect to the target 206. In some examples, the target 206 is silicon layer (such as a-Si) on a substrate that is transparent to the line beam.

The pulsed fiber laser 202 is configured to produce optical pulses at power levels, repetition rates, and wavelengths that produce local surface melting and recrystallization along the scanned line beam. In an example, the pulsed fiber laser 202 is a PFL 250 GREEN fiber laser produced by nLIGHT Corporation. Pulse durations can range from about 0.7 ns to about 1.5 ns at pulse repetition rates of 80-120 kHz with pulse energies of up to about 60 µJ at a wavelength of about 532 nm. In contrast to ELA, the absorption depth of 532 nm radiation is deeper than that of the shorter wavelength excimer radiation (about 308 nm) and the pulse duration is considerably shorter (about 1 ns as opposed to about 25-60 ns).

The line beam can be configured for exposure of a selected target area based on substrate size, pulse energy, and preferred beam overlap. Scanning speed is selected to produce a desired target fluence. Typically, effective fluences range from about 10 mJ/cm$^2$ to about 1000 mJ/cm$^2$, about 20 mJ/cm$^2$ to about 500 mJ/cm$^2$ or about 50 mJ/cm$^2$ to about 125 mJ/cm$^2$.

Exposure parameters such as scan rate, line beam size, and pulse energy can be established to produce selected exposure fluences and line beam overlaps. Increased numbers of meltings and recrystallizations in a single area associated with higher fluences tend to produce larger grain sizes, and exposures can be selected accordingly.

The fiber laser system 202 of FIG. 2 produces optical pulses at 532 nm, for which silicon has a smaller absorption coefficient (on the order of $2\times10^4$/cm) that at 308 nm (on the order of $2\times10^5$/cm). Other wavelengths than 532 nm can be selected, and exposure parameters can be adjusted based on the differing absorption coefficients. Exposures at wavelengths and/or combinations of wavelengths between 400 nm and 1 µm or 500 nm and 1 µm are convenient.

Figure 3:
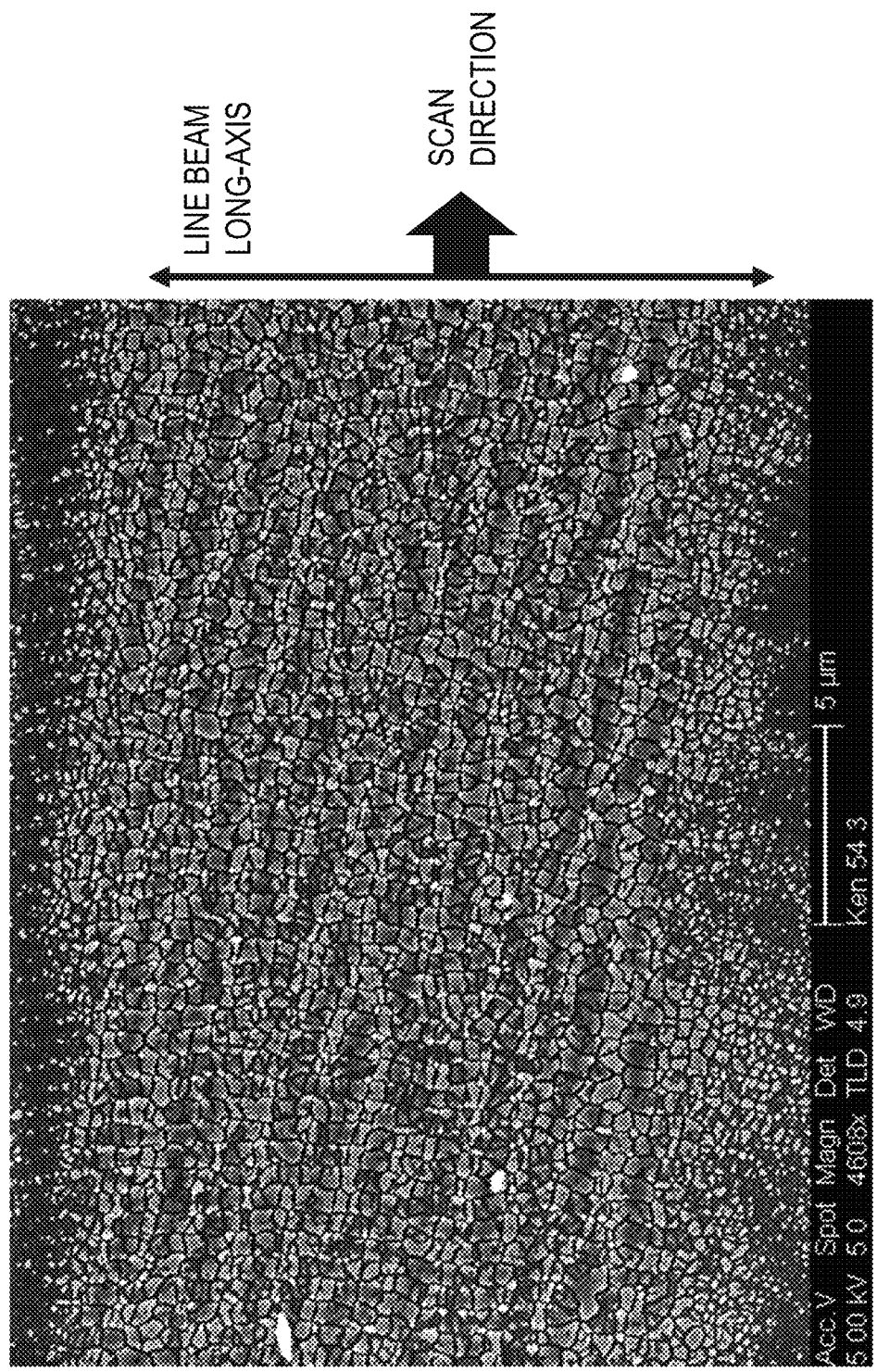
FIGS. 3-4 illustrate representative a-Si substrates processed with an apparatus such as shown in FIG. 2.
Figure 4:
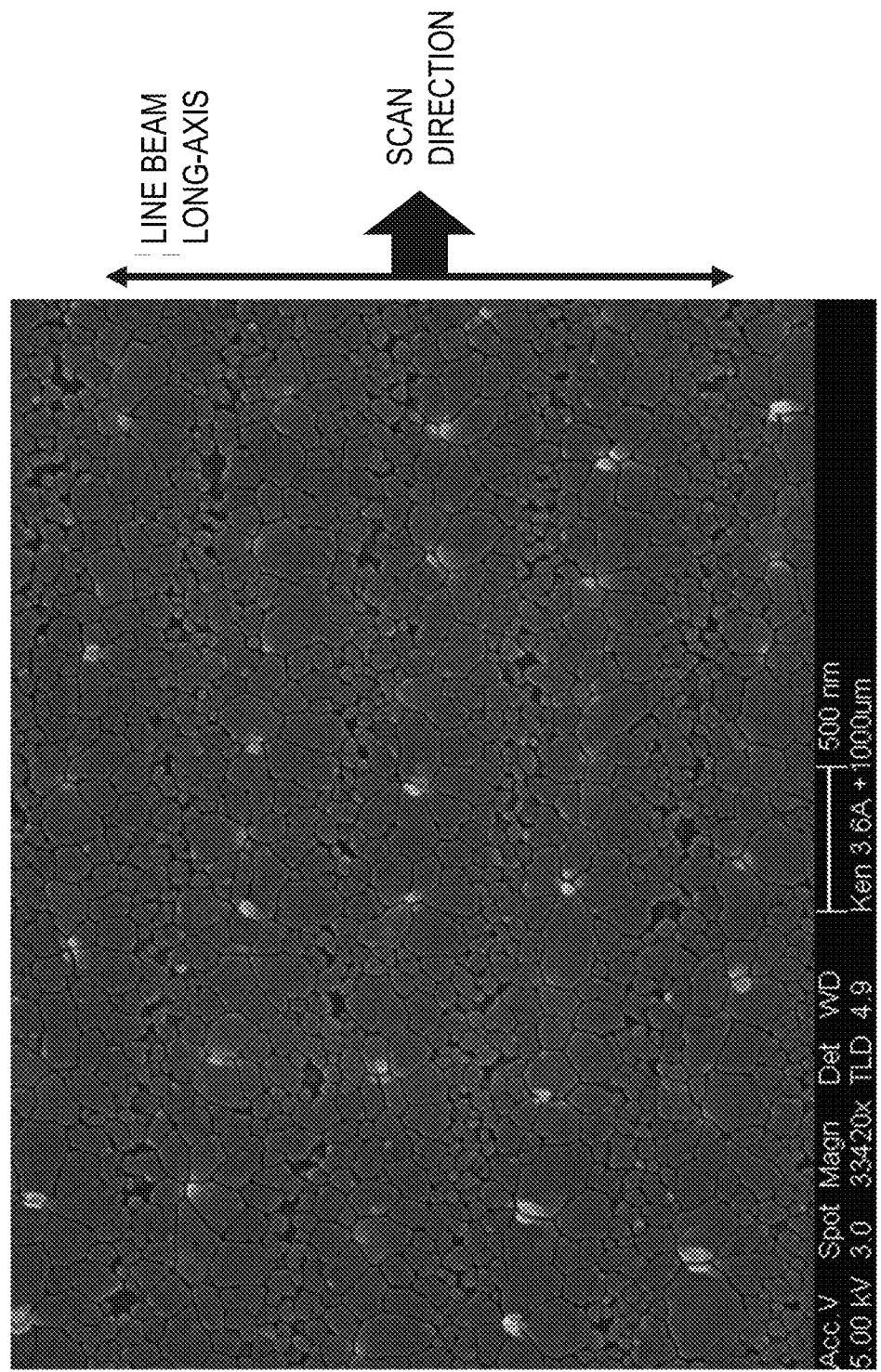

FIGS. 3-4 illustrate a-Si substrates processed with an apparatus such as that of FIG. 2. Recrystallized Si grains are apparent and exhibit size variations that are associated with interference effects in the line beam. Line beam and scan directions are indicated. While Si grains are formed using green laser annealing (GLA) with a pulsed fiber laser as shown, the Si grains are not arranged in a rectangular array. Electrical properties of ELA LTPS are dependent on orientation with respect to the rectangular array of Si grains. In contrast, randomly or quasi-randomly arranged Si grains obtained with GLA can exhibit no or little variation in electrical properties as a function of Si layer orientation. With such layers, polysilicon layer alignment to the TFT array can be omitted in most manufacturing processes, simplifying fabrication. As shown in FIGS. 3-4, uniform grain size can require uniform exposures, and in some cases, beam uniformity is further enhanced as discussed below to improve grain size consistency.

Figure 5:
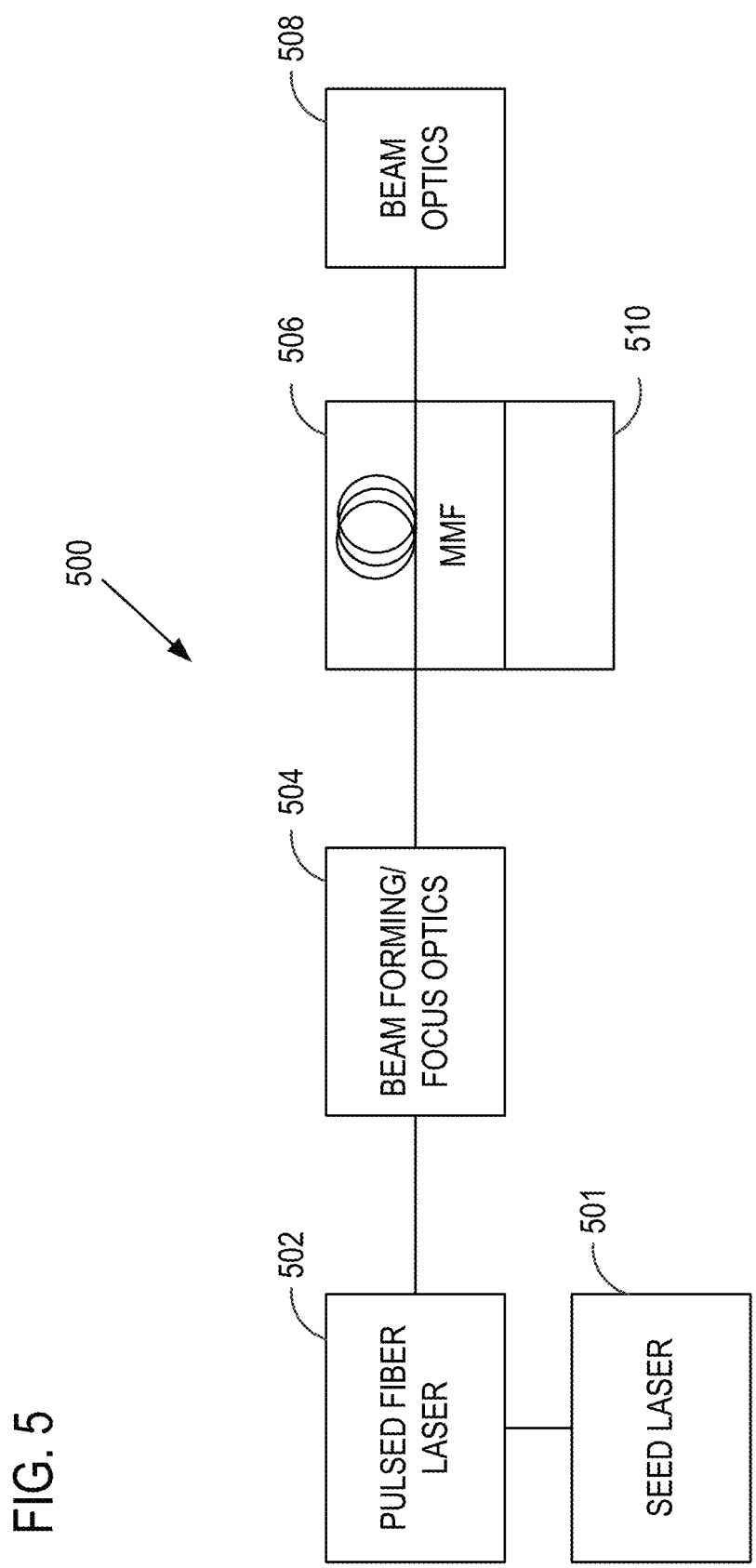
FIG. 5 is a block diagram of a laser system that includes a multimode fiber configured to broaden laser pulse spectra based on Raman scattering.

Line beams can exhibit interference effects such as diffraction or speckle due to coherence. Beam coherence can be reduced in several ways as disclosed below, and one or more of these approaches can be used to improve line beam uniformity and reduce beam intensity variations due to interference effects. Referring to FIG. 5, a Raman enhanced laser system 500 includes a pulsed fiber laser 502 that is situated to direct a series of laser pulses to a beam forming optical system 504. A seed laser source 501 is coupled to the pulsed fiber laser 502 so as to initiate laser pulse formation. The beam forming optical system 504 focuses the laser pulses into a multimode fiber (MMF) 506, and beam optics 508 receive output pulses from the MMF 506, and can be configured to form a line beam or other beam shape for material processing. Combinations of spherical and cylindrical optical elements can be used. The MMF 506 is generally coiled so as to increase the number of fiber modes excited.

The MMF 506 is selected so as to broaden a laser pulse spectrum based on Raman scattering. Laser power and MMF length are convenient parameters. For laser pulses at 532 nm, output pulses are produced that are spectrally enhanced by Raman scattering. As Raman scattering is a nonlinear (intensity dependent) effect, laser power is selected to achieve suitable Raman conversion. In addition, MMF length can be selected to provide suitable interaction length so as to enhance Raman scattering. By exciting multiple different Stokes wavelengths, multiple incoherent modes in the MMF 506 are excited. In some examples, a piezoelectric transducer 510 is situated to vary laser pulse coupling into the MMF 504. Vibrations rates on the order of the laser pulse repetition rate are preferred.

Figure 6A:
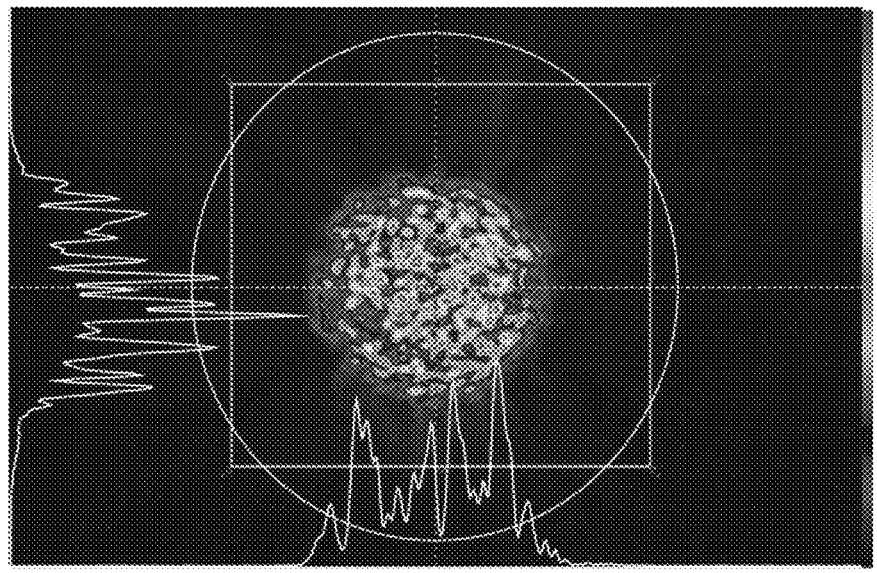
FIGS. 6A-6B illustrate increased optical beam uniformity based on Raman scattering in a 10 m long multimode optical fiber having a 50 µm core diameter.
Figure 6B:
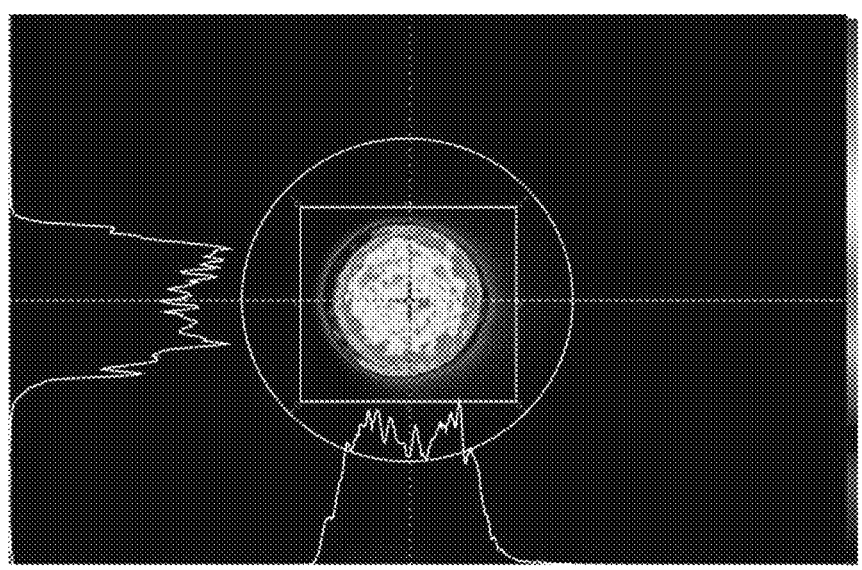
Figure 7A:
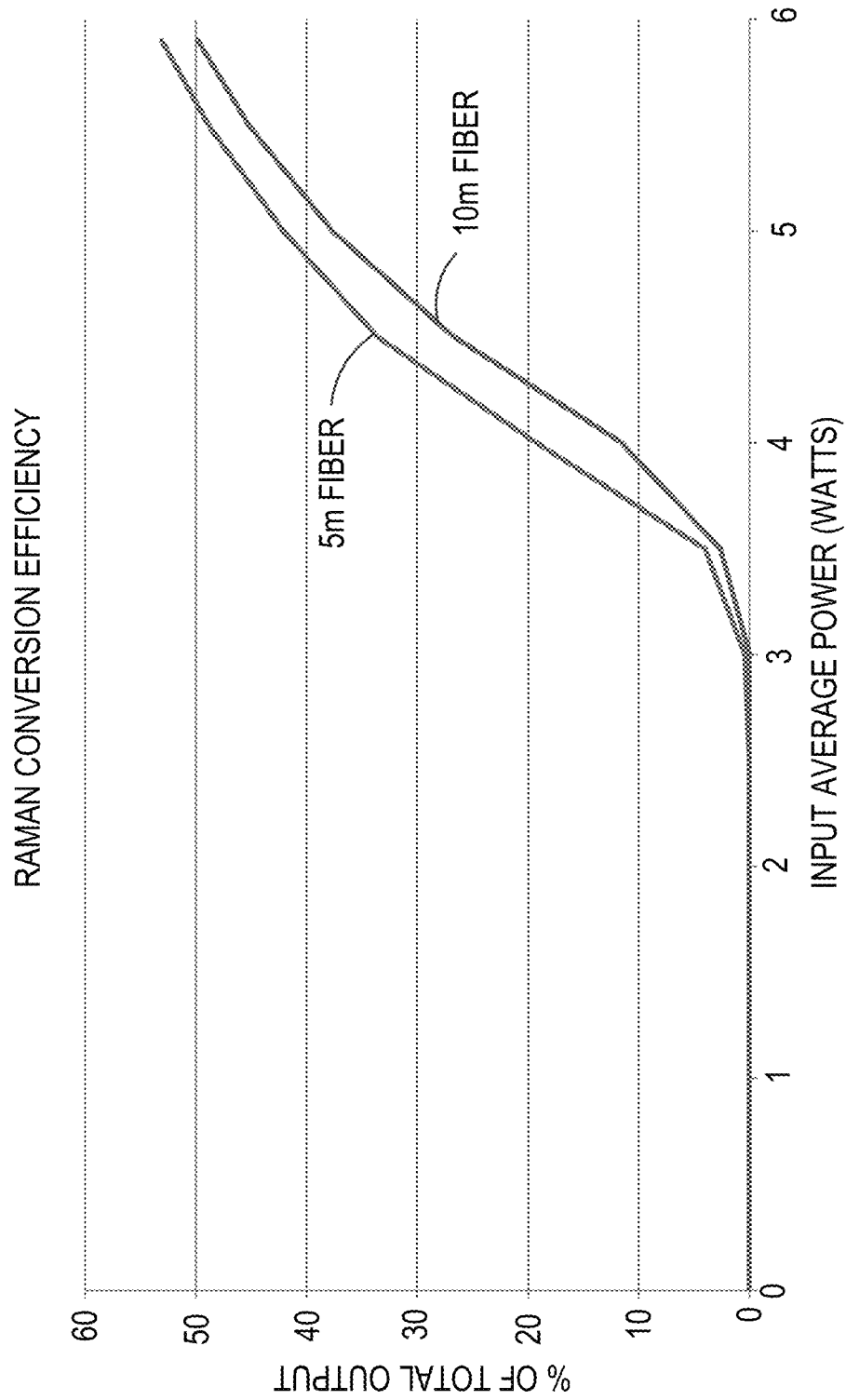
FIG. 7A is a graph of Raman conversion efficiency as a function of input average power using 5 m and 10 m lengths of 50 µm core fiber.
Figure 7B:
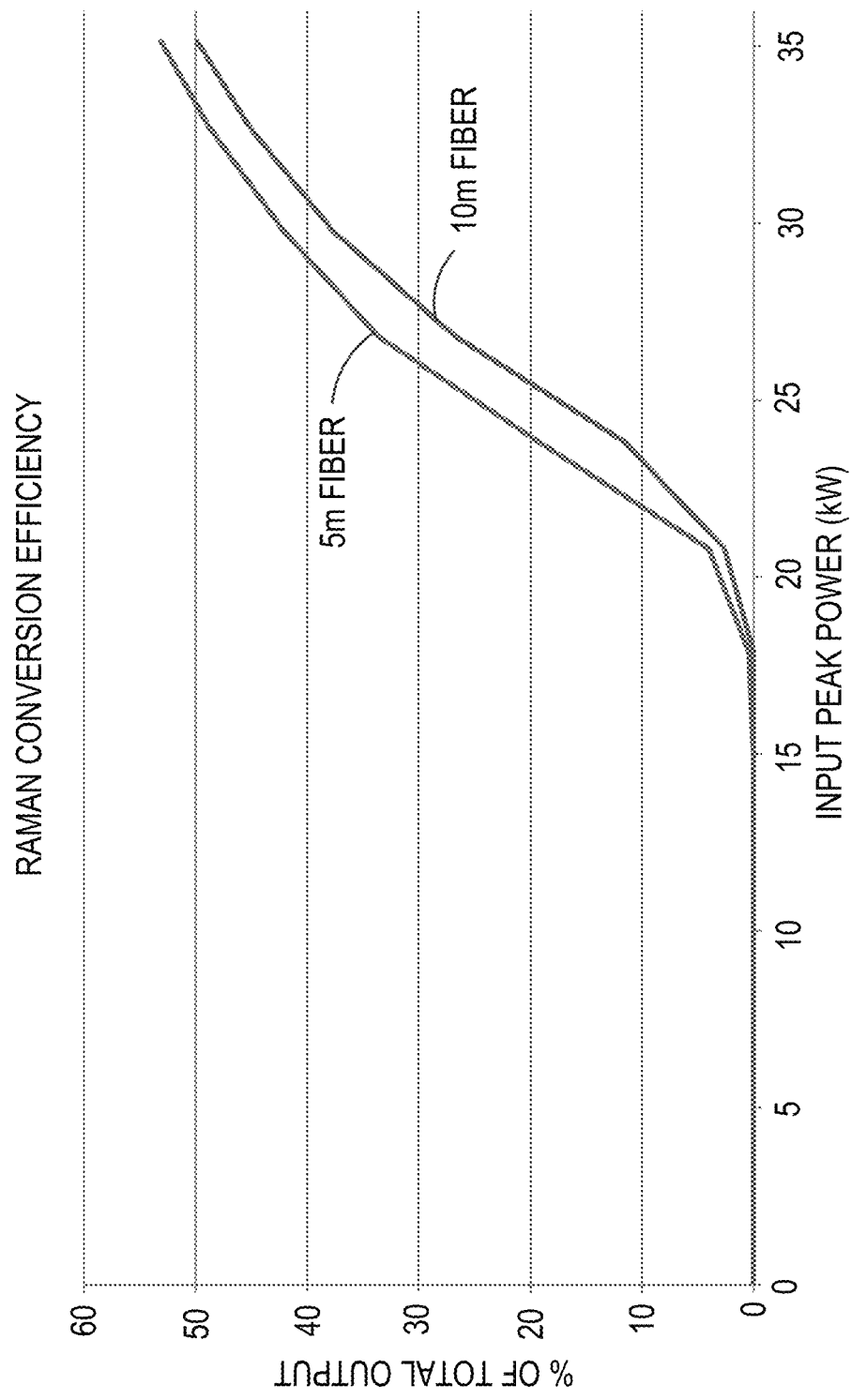
FIG. 7B is a graph of Raman conversion efficiency as a function of input peak power using 5 m and 10 m lengths of 50 µm core fiber.

FIG. 6A illustrates an intensity distribution at an output of the MMF 506 corresponding to seed laser power only. Intensity variations are pronounced. FIG. 6B illustrates an intensity distribution at a laser output power of 5.9 W, sufficient to produce Raman scattering. Improvements in uniformity are apparent. FIGS. 7A-7B illustrate Raman conversion efficiencies as a functions of input average power and input peak power for 5 m and 10 m lengths of 50 µm core diameter MMF for a pulsed laser at 532 nm and pulse lengths of about 1 ns. Suitable average and/or peak powers can be selected to obtain a preferred conversion efficiency so as to provide a less coherent output beam for focusing with fewer coherence effects.

Figure 8A:
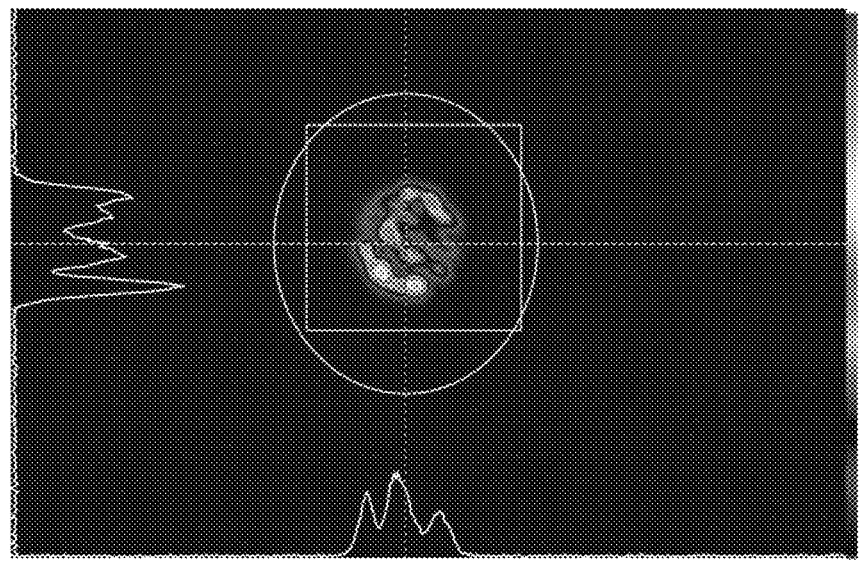
FIGS. 8A-8B illustrate increased optical beam uniformity based on Raman scattering in a 10 m long multimode optical fiber having a 25 µm core diameter and a 250 µm cladding diameter.
Figure 8B:
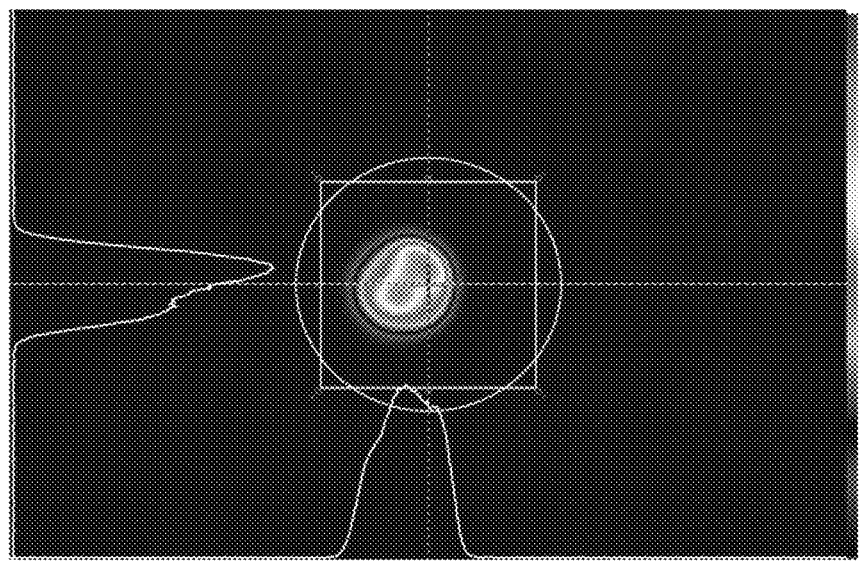

In other examples, fibers of different core diameters can be used to increase peak intensity and enhance Raman conversion efficiency. FIG. 8A illustrates an intensity distribution of seed light at an output of a 25 µm core/250 µm clad diameter fiber having a 5 m length. FIG. 8B illustrates an intensity distribution of Raman shifted light only (with 532 nm portions removed with an optical filter) at a laser output power of 5.5 W, sufficient to produce Raman scattering. As with the previous example, improvements in uniformity are apparent.

Figure 9:
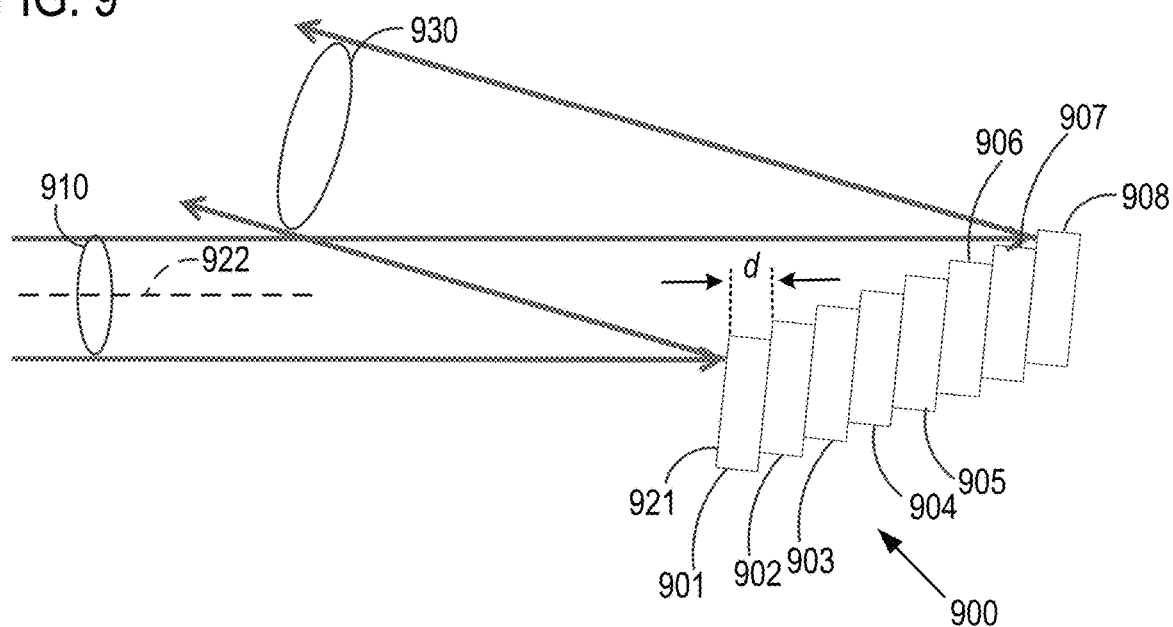
FIG. 9 illustrates an arrangement of stepped reflectors situated to reduce beam spatial coherence.

In the approaches above, beam coherence is reduced by extending the pulse spectral bandwidth using a nonlinear process (Raman scattering). In other examples, improved line beam uniformity can be obtained by introducing phase delays in some portions of the beam. With reference to FIG. 9, an input laser beam 910 is directed to a stack 900 of offset reflectors 901-908 that are configured to produce a reflected beam 930. Each of the stacked reflectors 901-908 includes a respective reflective surface. For example, the reflector 901 includes a reflective surface 921. A reflective surface spacing d along an input beam axis 922 is associated with stepped phase differences applied to respective beam portions. Surface spacing d can be selected to reduce beam coherence, i.e., to reduce beam coherence length. In one example, the surface spacing d is selected to be at least about 0.1, 0.2, 0.5, 1, or 2 times a beam coherence length. A number of reflectors can be varied, and reflectors can be spaced apart, and not stacked together as shown in FIG. 9. Spacing need not be uniform, and reflective surfaces can be spaced arbitrarily or with increasing or decreasing spacings.

Figure 10:
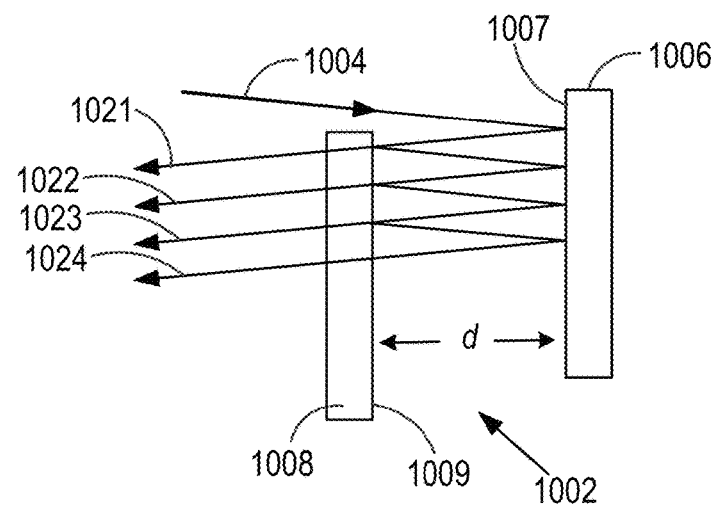
FIG. 10 illustrates an arrangement of two reflectors situated to reduce beam spatial coherence.

With reference to FIG. 10, a reflector pair 1002 is configured to reduce spatial coherence of a laser beam input along an axis 1004. A first mirror 1006 and a second mirror 1008 are separated by a distance d and have respective reflective surfaces 1007, 1009. The reflective surface 1007 can be configured to approach 100% reflectivity, and the reflective surface 1009 configured to be partially reflective so that a series of reflected beam portions are directed along axes 1021-1024. The reflective surface can have a varying reflectance that is lower or higher for beam portions that experience more reflections. Amplitudes of beam portions associated with the axes 1021-1024 can be selected by supplying a suitable varying reflectance. In other examples, the reflectance of the reflective surface 1109 can be wavelength dependent as a function of position so that each of the axes 1021-1028 is associated with a different wavelength range. Reflective surface spacing is typically selected based on a coherence length.

Figure 11A:
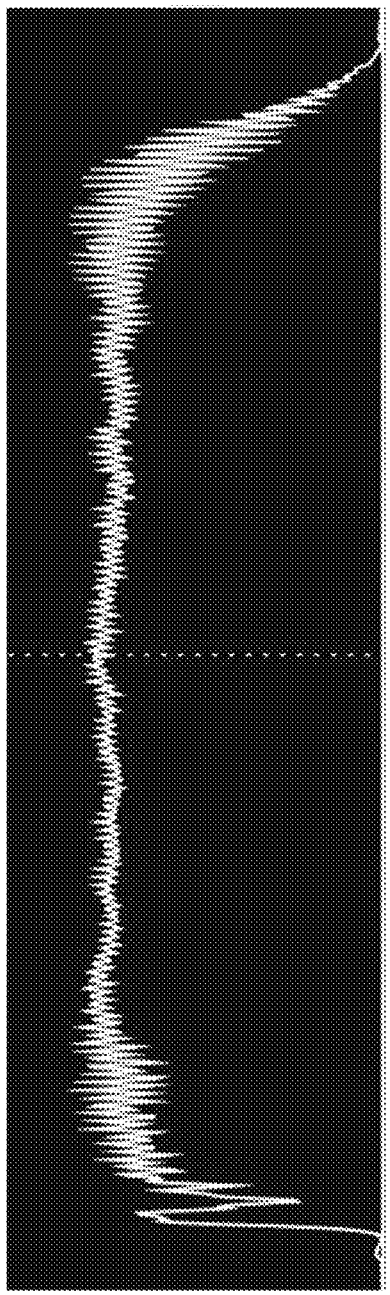
FIGS. 11A-11B illustrate reduction of interference effects using stepped reflectors having 15 mm and 50 mm separations, respectively.
Figure 11B:
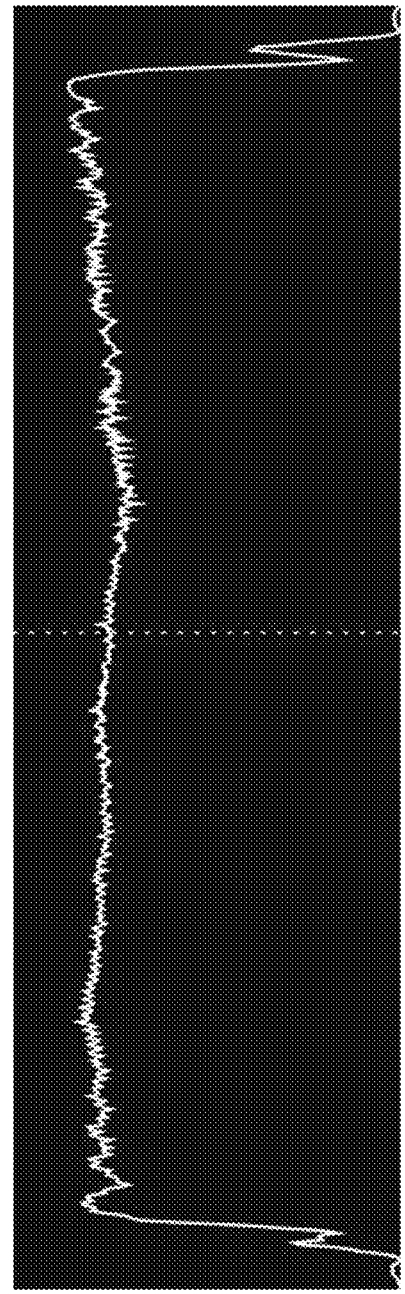

FIGS. 11A-11B are cross sections of line beams associated with 15 mm and 50 mm stepped mirror delays, respectively. Interference effects are reduced, with the reduction greater with the 50 mm stepped mirror delay.

Figure 12:
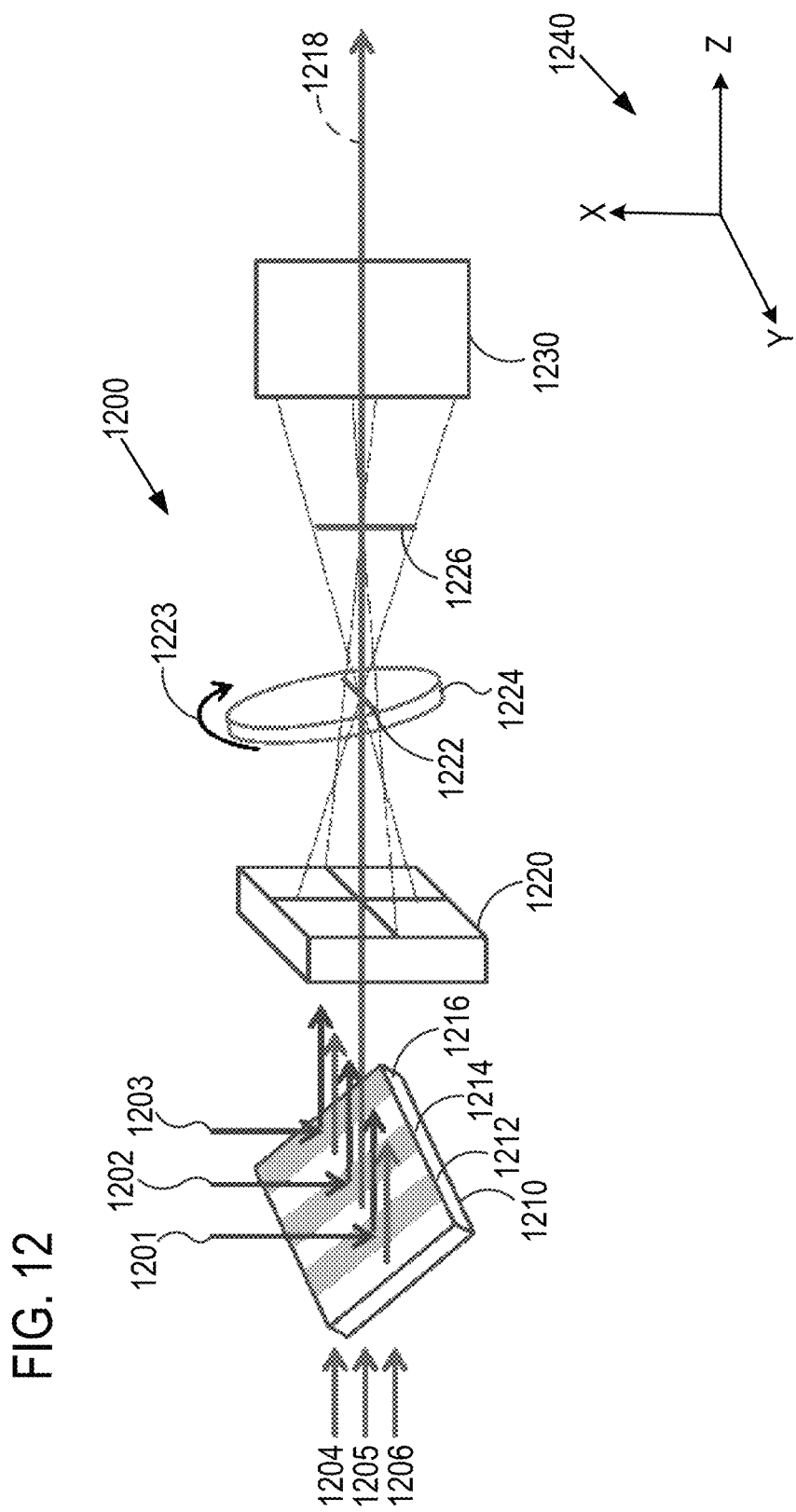
FIG. 12 illustrates a system for reducing beam coherence based on an interleaver situated to combine multiple beams and a diffuser situated at a beam focus.

FIG. 12 illustrates an optical system 1200 configured to combine beams 1201-1206 that are directed to an interleaver 1201 having reflective strips 1212, 1214, 1216. A combined beam is directed along an axis 1218 to an optical system 1220 that includes one or more spherical and cylindrical optical elements and produces beam foci 1222, 1226 that extends along an x-axis and y-axis, respectively, of an xyz coordinate system 1240. A rotatable diffuser 1224 is situated at or near one of the foci 1222, 1236 and is coupled to a motor or other device so as to rotate in a direction 1223. An optical system 1230 is situated to receive the diffused optical beam and direct the optical beam to a target or to other beam shaping optics. In typical examples, the rotatable diffuser 1224 is situated at or near a beam focus at which a more uniform cross-section of a beam is narrow. The rotatable diffuser 1224 can be rotated from an edge or about a central shaft, and drive mechanisms placed to avoid blocking optical beams.

Figure 13:
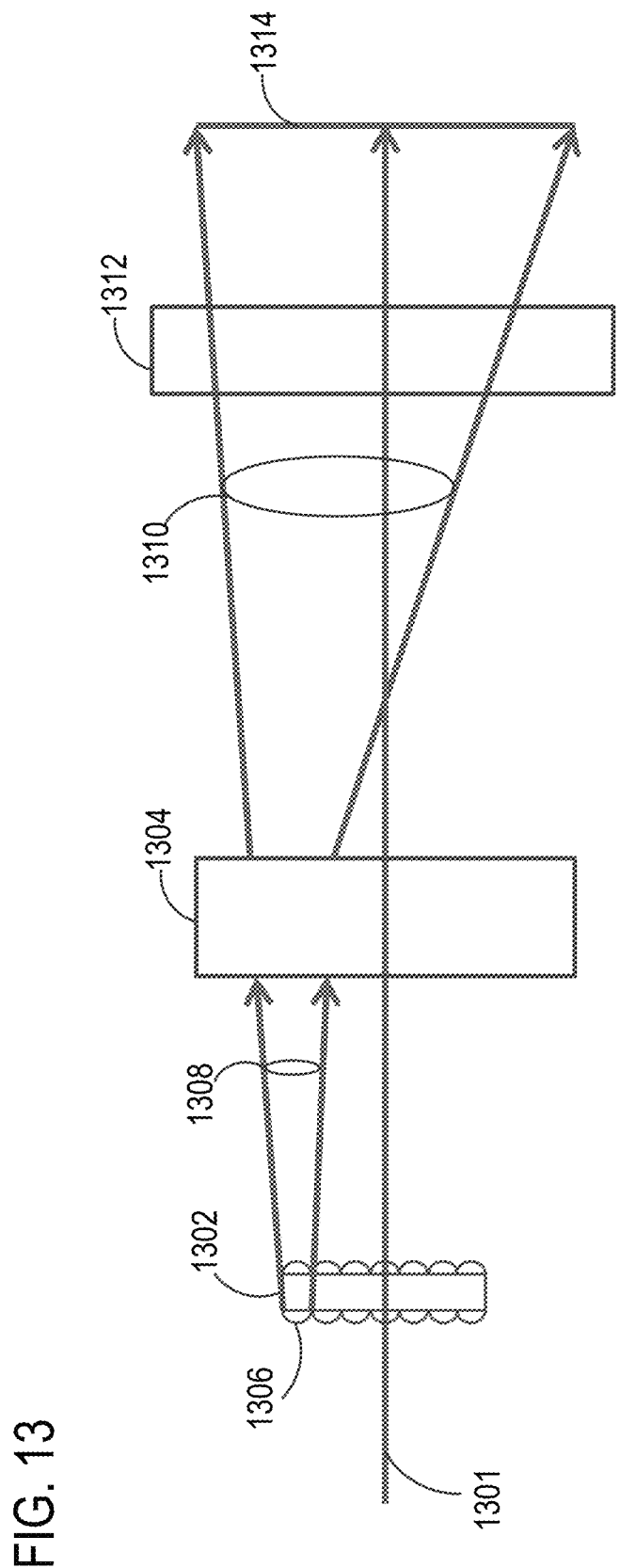
FIG. 13 is an optical system for reducing beam interference effects that includes a fly eye lens.

FIG. 13 illustrates an optical system 1300 that includes a fly-eye lens 1302 or a diffuser situated to receive a pulsed laser beam propagating along an axis 1301. A lens 1304 receives beam portions produced by the fly-eye lens 1302 and directs the beam portions to a line shaping lens 1312. For example, a fly-eye lens element 1304 produces a beam portion 1308 that is expanded by the lens 1304 to a beam portion 1310. The line shaping (cylindrical) lens 1312 receives the beam portions and forms a line image 1312 based on overlapping beam portions produced by the fly-eye lens 1302. The lenses 1304, 1312 can be single element or multi-element lenses, and reflective, refractive, holographic, or other optical elements or combinations thereof can be used for beam shaping.

Figure 14:
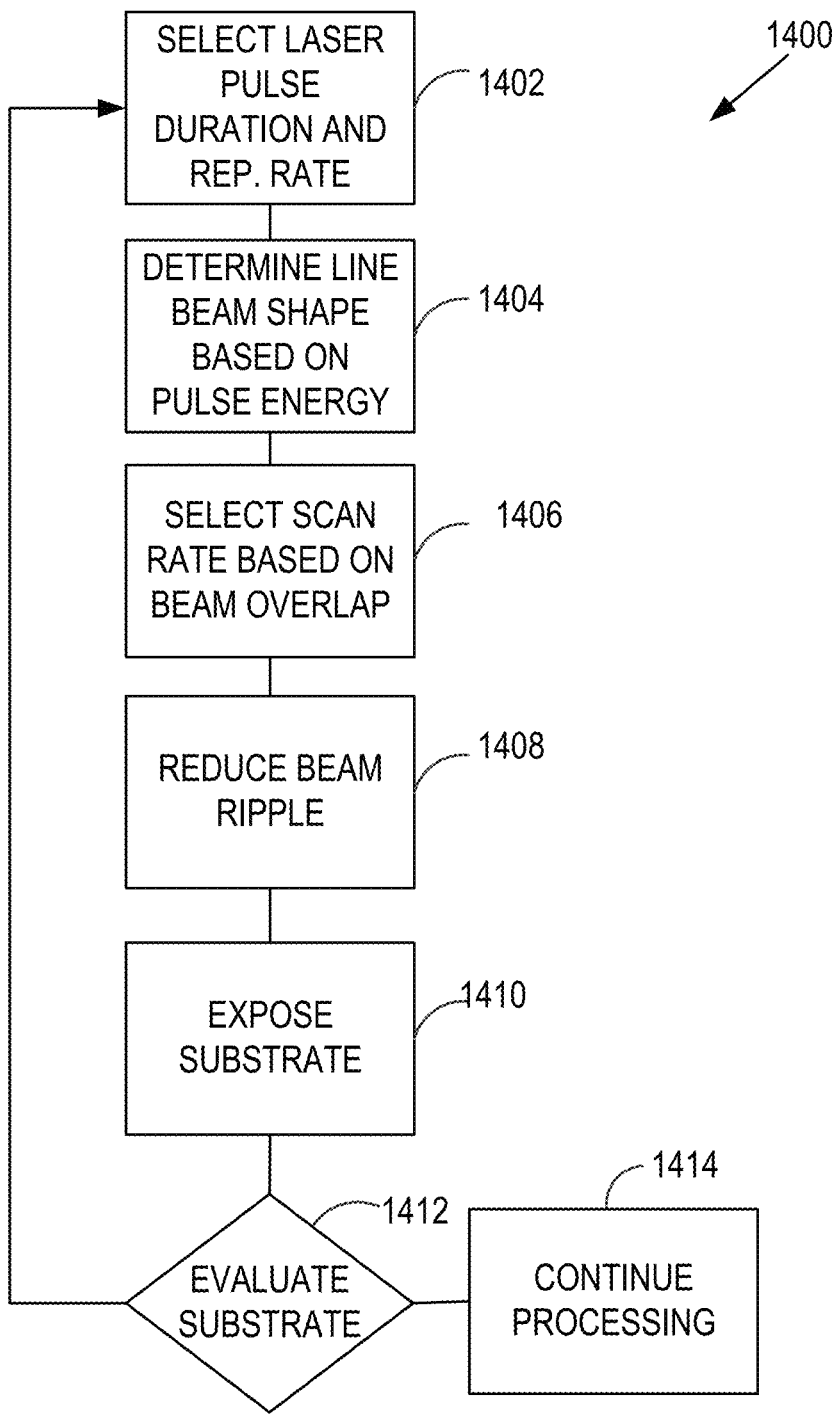
FIG. 14 is a block diagram of a representative method of processing a silicon layer using a pulsed fiber laser.

With reference to FIG. 14, a representative processing method 1400 includes selecting fiber laser pulse duration, pulse energy, and repetition rate at 1402. Line beam shape is selected at 1404 based on pulse energy and a size of an intended substrate. At 1406, scan rate is selected based on an overlap area desired between laser pulses. Beam ripple is reduced at 1408 by Raman scattering or introduction of phase delays to different beam portions, or using a diffuser or fly-eye lens. At 1410, a substrate is exposed as the beam is scanned with respect to the substrate, the substrate is scanned with respect to the beam, or a combination thereof. At 1412 the substrate is evaluated. For example, for an a-Si layer, the layer can be evaluated based on crystal grain size or mobility. If the exposed layer is not satisfactory, exposure can be reconfigured by returning to 1402. Otherwise, processing continues at 1414.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A laser annealing system, comprising:
   a pulsed laser configured to provide laser pulses of pulse durations less than 10 ns at a repetition rate of between 10 kHz and 1 MHz;
   an optical system configured to receive the laser pulses and produce a line beam; and
   a scanning assembly configured so that the line beam and a substrate move with respect to each other so that the line beam is scanned across a substrate surface, wherein a line beam area is selected so that the repetitive laser pulses produce repetitive melting of an a-Si layer on the substrate surface that produces a processed silicon layer with a mobility of at least about 5 $cm^2$/V-sec.

2. The laser annealing system of claim 1, wherein the laser pulses have durations of between about 0.5 and 2 ns, the pulse repetition rate is between 70 and 120 kHz, a pulse wavelength spectrum between about 500 nm and 1000 nm, and the pulse energy is between about 10 and 100 μJ.

3. The laser annealing system of claim 2, further comprising a laser pulse spectrum enhancer configured to receive the laser pulses and produce spectrally broadened pulses based on Raman scattering.

4. The laser annealing system of claim 2, wherein the laser spectrum enhancer includes a multimode fiber configured to provide Raman scattering.

5. The laser annealing system of claim 1, further comprising a stepped mirror assembly that includes at least two reflective surfaces configured to provide a phase delay between different laser pulse portions, wherein the phase delay is based on a reflective surface separation.

6. The laser annealing system of claim 5, wherein the phase delay corresponds to a reflective surface separation of at least 10 mm.

7. The laser annealing system of claim 3, wherein the phase delay corresponds to a reflective surface separation of at least 40 mm.

8. A method of processing a silicon layer, comprising:
   exposing the silicon layer to a plurality of laser pulses with a wavelength spectrum between about 500 nm and 1000 nm to form substantially randomly oriented crystalline silicon grains having dimensions of between about 200 nm and 500 nm and a mobility of at least 50 $cm^2$/V-s; and
   processing the exposed silicon layer to define thin film transistors;
   wherein the plurality of laser pulses comprise laser pulses of pulse durations less than 10 ns at a repetition rate of between 10 kHz and 1 MHz.

9. The method of claim 8, wherein the laser pulses are produced with a pulsed fiber laser that produces laser pulses having a duration of between about 0.5 ns and 5 ns, and the laser pulses are subjected to Raman scattering to produce spectrally enhanced pulses prior to exposing the silicon layer.

10. An active matrix display, comprising an active matrix that includes a silicon layer processed as recited in claim 8.

11. The laser annealing system of claim 1, wherein the pulse durations are less than about 10 ns.

12. The laser annealing system of claim 1, wherein the repetitively melted a-Si layer corresponds to a processed silicon layer having a mobility of at least about 50 $cm^2$/V-sec.

13. The laser annealing system of claim 1, wherein the repetitively melted a-Si layer corresponds to a processed silicon layer having a mobility of at least about 100 $cm^2$/V-sec.

14. The laser annealing system of claim 1, wherein the repetitively melted a-Si layer corresponds to a processed silicon layer having silicon crystal grains having an average grain size of between about 200 nm and 500 nm.

15. The laser annealing system of claim 1, wherein the repetitively melted a-Si layer corresponds to a processed silicon layer comprising unoriented silicon crystal grains having a grain size of between about 200 nm and 500 nm.

16. The laser annealing system of claim 15, wherein the substrate includes a transparent support having an a-Si layer on at least one surface.

17. The laser annealing system of claim 1, wherein scanning assembly is configured to scan the line beam such that an effective fluence at the substrate surface is between about 20 $mJ/cm^2$ and 200 $mJ/cm^2$.

18. The laser annealing system of claim 3, wherein the laser pulse spectrum enhancer is configured to frequency shift at least about 10% of the pulse energy of the received laser pulses through Raman scattering.

19. The laser annealing system of claim 18, wherein the laser pulse spectrum enhancer is configured to frequency shift at least about 25% of the pulse energy of the received laser pulses through Raman scattering.

20. A laser annealing system, comprising:
a pulsed laser configured to provide laser pulses of pulse durations less than 10 ns at a repetition rate of between 10 kHz and 10 MHz;
an optical system configured to receive the laser pulses and produce a line beam;
a scanning assembly configured so that the line beam and a substrate move with respect to each other so that the line beam is scanned across a substrate surface, wherein a line beam area is selected so that the repetitive laser pulses produce repetitive melting of an a-Si layer on the substrate surface; and
a stepped mirror assembly that includes at least two reflective surfaces configured to provide a phase delay between different laser pulse portions, wherein the phase delay is based on a reflective surface separation.

* * * * *